(12) United States Patent
Sharvit et al.

(10) Patent No.: US 11,784,409 B2
(45) Date of Patent: Oct. 10, 2023

(54) HIGH-RESOLUTION PHASE SHIFTER

(71) Applicant: Gilat Satellite Networks Ltd., Petah Tikva (IL)

(72) Inventors: Nir Sharvit, Oranit (IL); Tom Heller, Carmiel (IL)

(73) Assignee: Gilat Satellite Networks Ltd., Petah Tikva (IL)

( * ) Notice: Subject to any disclaimer, the term of this patent is extended or adjusted under 35 U.S.C. 154(b) by 0 days.

(21) Appl. No.: 17/713,887

(22) Filed: Apr. 5, 2022

(65) Prior Publication Data

US 2022/0285838 A1     Sep. 8, 2022

Related U.S. Application Data

(63) Continuation of application No. 16/901,326, filed on Jun. 15, 2020, now Pat. No. 11,329,378, which is a continuation of application No. 15/959,931, filed on Apr. 23, 2018, now Pat. No. 10,727,587.

(60) Provisional application No. 62/490,251, filed on Apr. 26, 2017.

(51) Int. Cl.
| | | |
|---|---|---|
| *H01Q 3/36* | (2006.01) | |
| *H01P 5/16* | (2006.01) | |
| *H03H 11/20* | (2006.01) | |
| *H03F 3/24* | (2006.01) | |
| *H03F 3/19* | (2006.01) | |

(52) U.S. Cl.
CPC ............ *H01Q 3/36* (2013.01); *H01P 5/16* (2013.01); *H03H 11/20* (2013.01); *H03F 3/19* (2013.01); *H03F 3/245* (2013.01); *H03F 2200/294* (2013.01); *H03F 2200/451* (2013.01)

(58) Field of Classification Search
CPC .............. H01Q 3/36; H01P 5/16; H03H 11/20
USPC ......................................................... 342/372
See application file for complete search history.

(56) References Cited

U.S. PATENT DOCUMENTS

| | | | |
|---|---|---|---|
| 4,638,190 A | 1/1987 | Hwang et al. | |
| 4,737,739 A | 4/1988 | Rosier et al. | |
| 4,977,382 A | 12/1990 | Podell et al. | |
| 5,049,841 A | 9/1991 | Cooper et al. | |
| 6,020,848 A | 2/2000 | Wallace et al. | |

(Continued)

FOREIGN PATENT DOCUMENTS

| | | | |
|---|---|---|---|
| CN | 206640556 U | * | 11/2017 |
| JP | 2792533 B2 | * | 9/1998 |

OTHER PUBLICATIONS

Nov. 13, 2018—Extended EP Search Report, EP App No. 18168945.6.

(Continued)

*Primary Examiner* — Harry K Liu
(74) *Attorney, Agent, or Firm* — Banner & Witcoff, Ltd.

(57) ABSTRACT

A radiation pattern of a phased array antenna, comprising a plurality of antenna elements, may be dynamically modified using phase shifters to apply variable phase shifts between antenna elements. In a phased array antenna designed for airborne applications, the phase shifters may be required to enable a fine phase-shifting resolution and to operate over a wide temperature range. The phase shifters may also be required to perform while exhibiting small process variations, small form factor, low power consumption, and low loss. One possible solution to this is a passive vector-interpolating phase shifter configured to exhibit such characteristics.

20 Claims, 6 Drawing Sheets

(56) References Cited

U.S. PATENT DOCUMENTS

| 9,634,611 | B1 | 4/2017 | Vera Villarroel et al. |
| 2010/0060353 | A1 | 3/2010 | Grebennikov et al. |
| 2011/0006826 | A1 | 1/2011 | Kang et al. |
| 2013/0088391 | A1 | 4/2013 | Corman et al. |
| 2016/0365859 | A1 | 12/2016 | Song et al. |

OTHER PUBLICATIONS

Aug. 8, 2018—EP Partial Search Report, EP App No. 18168945.6.
May 4, 2020—EP Office Action—EP 18168945.6.
On Semiconductor: "IGBT Gate Drive Consideration", Semiconductor Components Industries Application Note, Oct. 31, 2011 (Oct. 31, 2011), pp. 1-3, XP055688550, Retrieved from the Internet: URL:https://www.onsemi.com/pub/Collateral/AND9052-D.PDF.

* cited by examiner

HIGH-RESOLUTION PHASE SHIFTER

RELATED MATTERS

This application is a continuation of U.S. application Ser. No. 16/901,326, filed Jun. 15, 2020, and entitled "HIGH-RESOLUTION PHASE SHIFTER," which is a continuation of U.S. application Ser. No. 15/959,931, filed Apr. 23, 2018, and entitled "HIGH-RESOLUTION PHASE SHIFTER," which claims priority to U.S. Patent Application Ser. No. 62/490,251, filed on Apr. 26, 2017, and entitled "HIGH-RESOLUTION PHASE SHIFTER," the disclosure of which is incorporated by reference herein in its entireties and made part hereof.

FIELD

Aspects of the disclosure pertain to the design of phase shifters and to phased array antennas.

BACKGROUND

A phased array antenna usually includes an array of antenna elements. The radiation pattern of the phased array antenna can be dynamically modified by applying variable gain differences and/or phase shifts between the antenna elements. Unwanted variations in gain or in phase between the radiating elements result in off-axis emissions (side lobes) exceeding the regulation mask requirements. To prevent that, the necessary phase shifting and gain control should be applied at fine resolutions that are stable over temperature variations and over process variations.

A phased array antenna designed for satellite communications often requires a large number of radiating elements in order to achieve sufficient Effective Isotropic Radiated Power (EIRP) and Gain to (noise) Temperature (G/T) properties. Such specifications are derived from the distance between the terminal that uses such an antenna and the satellite, and due to strict satellite communications standards. In addition to the large number of radiating elements, such antenna also requires a large number of phase shifters and gain control devices (exhibiting fine resolution) that further contribute to high overall antenna power consumption. Therefore, the phase shifters and the gain control devices should be power-efficient.

Airborne radios (for in-flight connectivity) are required to operate over a wide range of temperatures with fast cycle time from hot temperatures (e.g., 50° C. while the aircraft is on the ground) to cold temperatures (e.g., −60° C. when the aircraft is at high altitudes). Gain controllers and phase shifters should tolerate such variations and present accurate performance over the entire temperature range.

The relatively large array size that is often needed for satellite communications and the power consumption considerations thereof, may create an incentive to use passive phase shifters for generating the necessary phase shifts between antenna elements of the array of antenna elements. Some known passive phase shifters are either of the reflective-type (i.e. a hybrid quadrature loaded by two reflective loads) or consist of a cascade of attenuators. Reflective-type phase shifters exhibit high gain variations over frequency and phase-shift settings, and are difficult to stabilize over temperature. Phase shifters consisting of cascades of attenuators are suitable for coarse phase resolution applications, however their insertion loss and size increase as the required phase shifting resolution increases (i.e. smaller phase shifting steps are needed).

SUMMARY

The following presents a simplified summary in order to provide a basic understanding of some aspects of the disclosure. The summary is not an extensive overview of the disclosure. It is neither intended to identify key or critical elements of the disclosure nor to delineate the scope of the disclosure. The following summary merely presents some aspects of the disclosure in a simplified form as a prelude to the description below.

Aspects of the disclosure are directed to a high resolution phase shifter. The high resolution phase shifter may be configured to exhibit fine phase-shifting resolution. Furthermore, the high resolution phase shifter may be configured to exhibit performance stability over a wide temperature range and over process variations. In some embodiments, the high resolution phase shifter may be configured to exhibit low (negligible) power consumption, small form factor, and/or low loss. In some embodiments, the high resolution phase shifter may comprise low insertion loss phase-inverting variable attenuators, which may be configured to exhibit high stability over a wide temperature range and over process variations.

Aspects of the disclosure are directed to a receiving phased array antenna and/or to a transmitting phased array antenna. Any of the receiving phased array antenna and the transmitting phased array antenna may comprise a plurality of antenna elements, wherein at least one antenna element of the plurality of antenna elements may comprise a high resolution phase shifter, e.g., as previously mentioned. In some embodiments, any of the receiving phased array antenna and the transmitting phased array antenna may be configured for satellite communications. In some embodiments, any of the receiving phased array antenna and the transmitting phased array antenna may be configured to be used as airborne antenna.

BRIEF DESCRIPTION OF THE DRAWINGS

Figure 1:
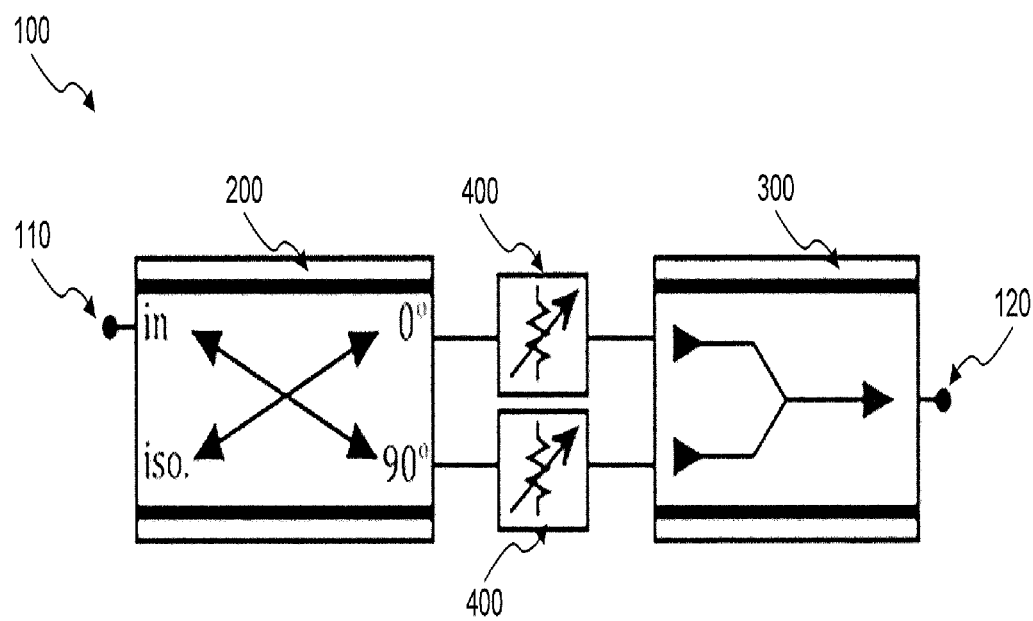

Having thus described the disclosure in general terms, reference will now be made to the accompanying drawings, which are not necessarily drawn to scale, and wherein:

FIG. 1 shows a block diagram of an example phase shifter according to aspects of the disclosure.

Figure 2:
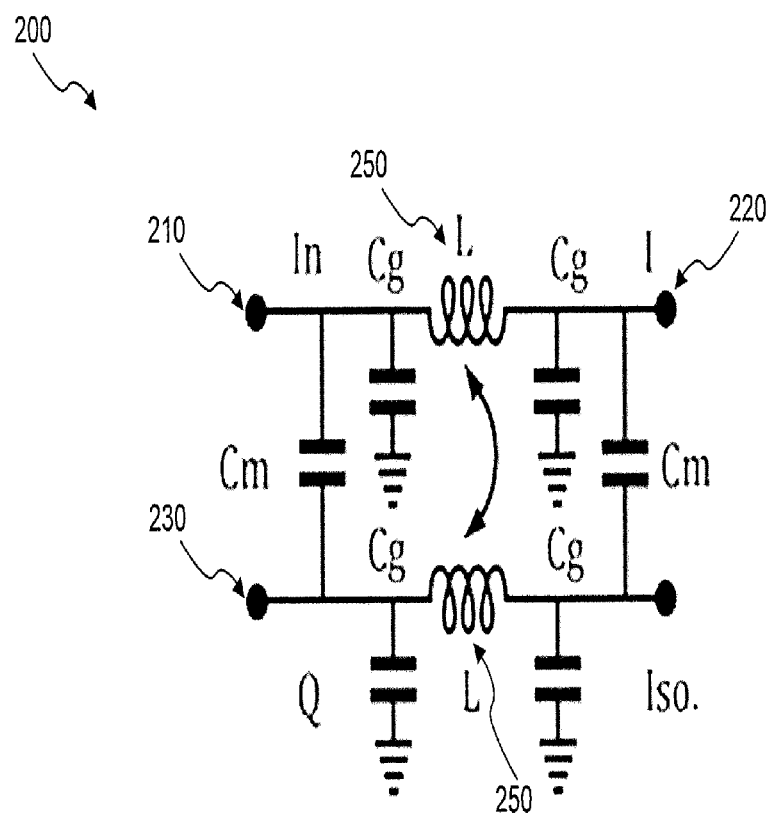

FIG. 2 shows a schematic of an example of a quadrature splitter in accordance with aspects of the disclosure.

Figure 3:
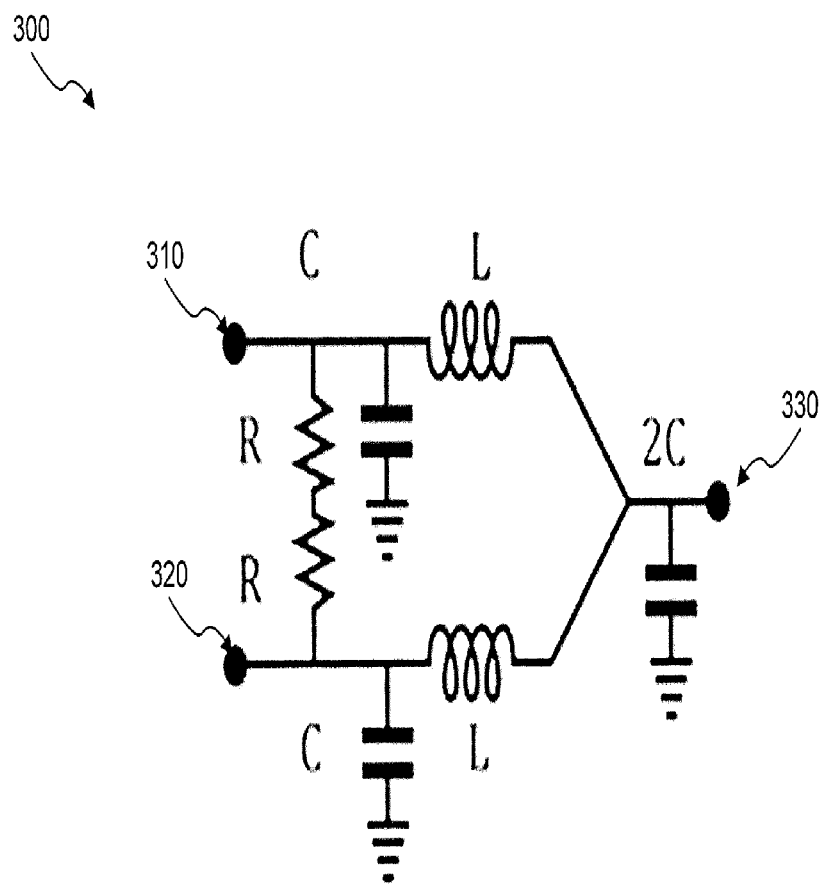

FIG. 3 shows a schematic of an example of a Wilkinson power combiner in accordance with aspects of the disclosure.

Figure 4:
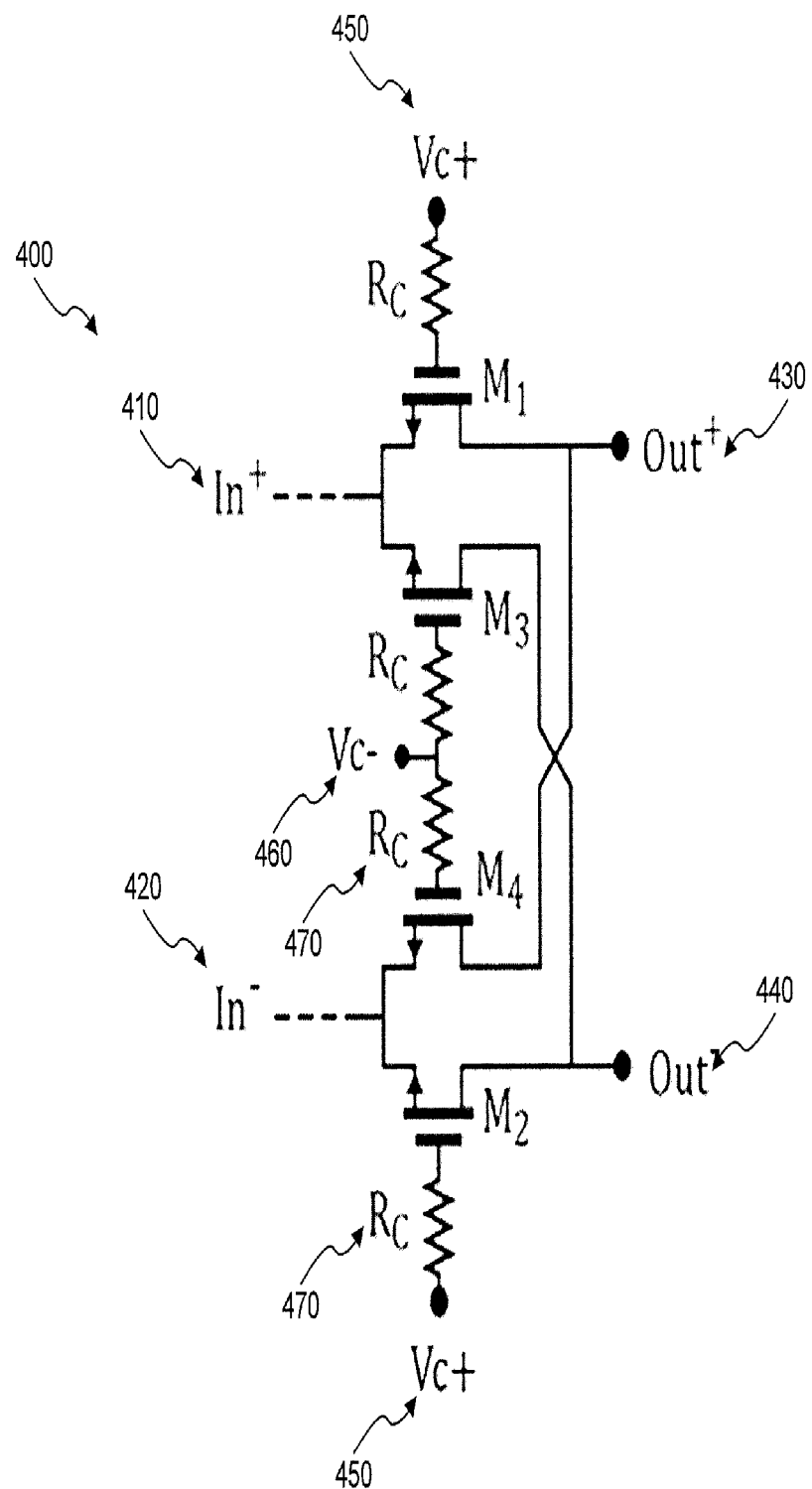

FIG. 4 shows a schematic of an example X-type attenuator in accordance with aspects of the disclosure.

Figure 5:
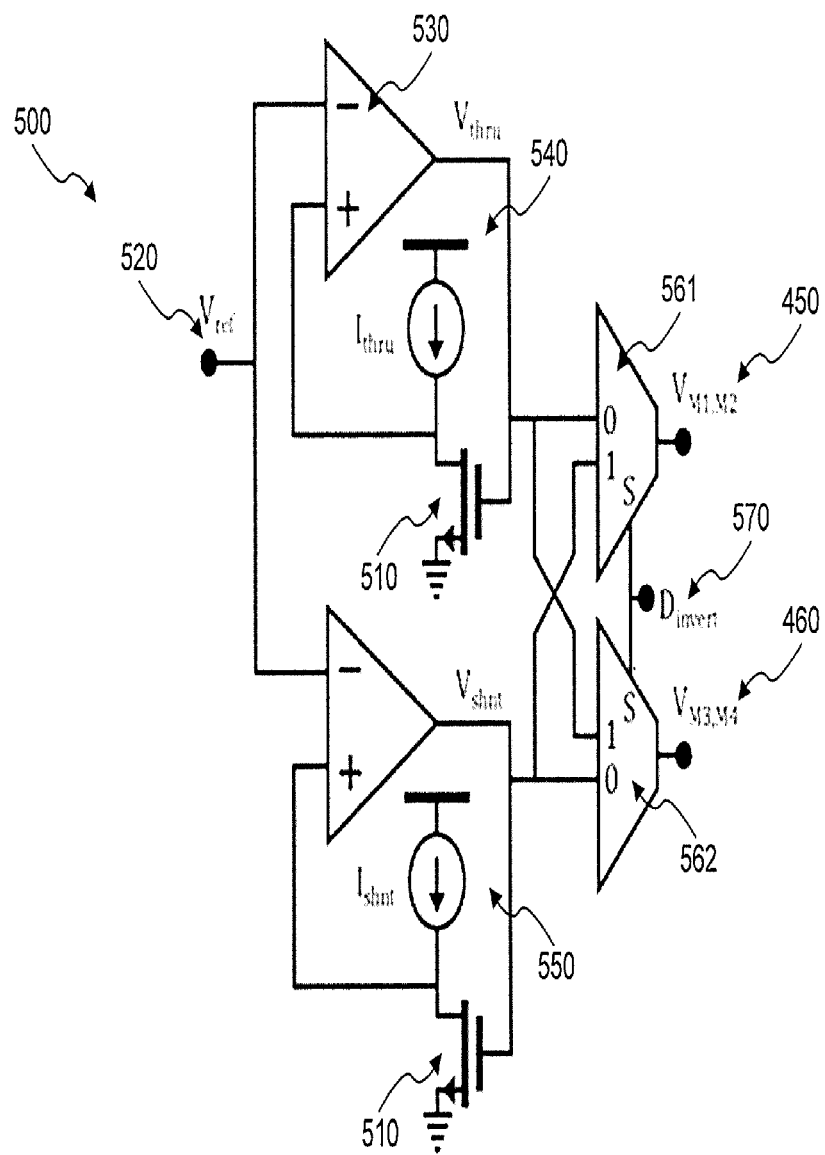

FIG. 5 shows a schematic of an example calibration circuit in accordance with aspects of the disclosure.

Figure 6:
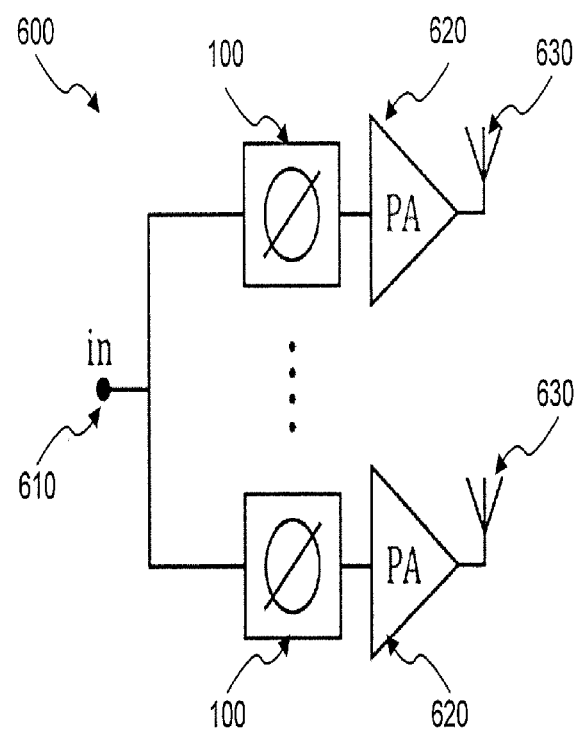
Figure 6:
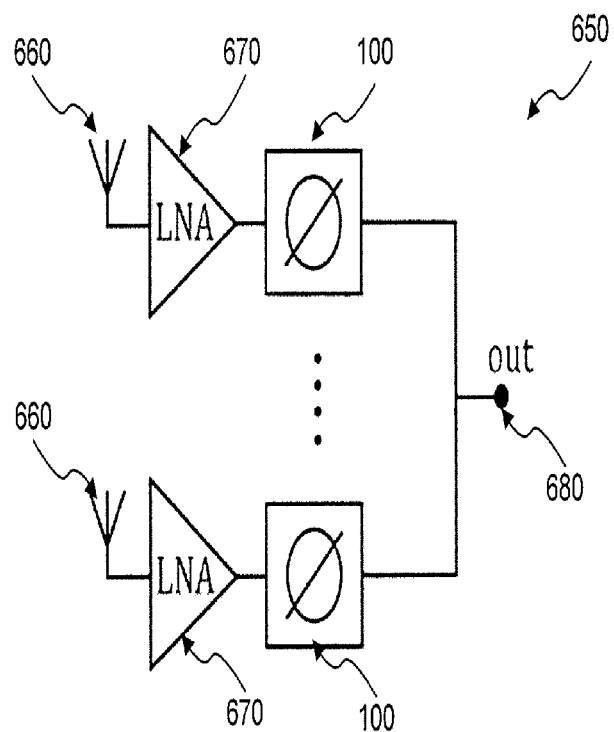

FIG. 6 shows block diagrams of example transmitting phased array antenna and example receiving phased array antenna in accordance with aspects of the disclosure.

DETAILED DESCRIPTION

FIG. 1 shows a block diagram of a (high resolution) phase shifter 100. Phase shifter 100 may comprise a differential quadrature hybrid splitter 200 (shown in FIG. 2), two phase inverting variable (X-type) attenuators 400 (shown in FIG. 4), and a differential power combiner 300 (shown in FIG. 3). In some embodiments, phase shifter 100 may be fabricated entirely on a single CMOS die.

The phase shifter 100 may be configured to apply a phase shift to an input signal using a Cartesian phase interpolation technique. A differential input signal 110 may be split into an I-component signal and a Q-component signal using the differential quadrature hybrid splitter 200. Amplitude scaling, either by amplification or attenuation, with or without phase inversion, may be separately applied to the I-component signal and to the Q-component signal using phase-inverting variable attenuators 400 to produce a scaled I-component signal and a scaled Q-component signal. The scaled component signals may be combined using differential power combiner 300 to produce a phase-shifted signal in reference to the differential input signal 110.

In reference to FIG. 2, the differential quadrature hybrid splitter 200 may be configured to receive an input signal 210 and to output (e.g., over two differential output ports) an I-component signal 220 and a Q-component signal 230 that may correspond to the input signal 210. In some embodiments, the differential quadrature hybrid splitter 200 may be an inductive-type lumped analog of a coupled-line hybrid coupler that may have smaller footprint than a distributed hybrid coupler.

Each of the two differential output ports of the differential quadrature hybrid splitter 200 (e.g., I and Q) may be coupled to the input terminals (410 and 420) of a phase-inverting variable attenuator 400 of the two phase inverting variable attenuators included in phase shifter 100. The output terminals (430 and 440) of each of the two phase inverting variable attenuators 400 may be coupled to a differential input port (e.g., of the two differential input ports 310 and 320) of the differential power combiner 300.

In reference to FIG. 3, the differential power combiner 300 may be configured to combine the signals provided at its input ports (310 and 320) and to output a combined signal through output port 330. In some embodiments, the differential power combiner 300 may be a lumped analog Wilkinson power combiner (e.g., as shown in FIG. 3), wherein a lumped analog Wilkinson power combiner may have smaller footprint than a standard (e.g., distributed) Wilkinson power combiner.

In reference to FIG. 4, the phase inverting variable attenuator 400 may comprise a differential input port comprising a first input terminal 410 and a second input terminal 420, and a differential output port comprising a first output terminal 430 and a second output terminal 440. The phase inverting variable attenuator 400 may comprise a first transistor M1 that may be coupled to the first input terminal 410 and to the first output terminal 430, a second transistor M2 that may be coupled to the second input terminal 420 and to the second output terminal 440, a third transistor M3 that may be coupled to the first input terminal 410 and to the second output terminal 440, and a fourth transistor M4 that may be coupled to the second input terminal 420 and to the first output terminal 430. In some embodiments, the first transistor M1, the second transistor M2, the third transistor M3 and the fourth transistor M4 (e.g., herein transistors M1 to M4) may be Field-Effect Transistors (FET).

The phase inverting variable attenuator 400 may be in one of two phase states, corresponding to a 0° phase (e.g., no phase inversion) and a 180° phase (e.g., phase inversion). In some embodiments, the phase state of the phase inverting variable attenuator 400 may be controlled by control voltages $V_{C+}$ (450) and $V_{C-}$ (460). The phase state of phase inverting variable attenuator 400 may be flipped when the control voltages $V_{C+}$ (450) and $V_{C-}$ (460) are flipped. Control voltage 450 may be coupled to the gate terminals of transistors M1 and M2. Control voltage 460 may be coupled to the gate terminals of transistors M3 and M4. The control voltages 450 and 460 may be coupled to the respective gate terminals of transistors M1 to M4 through "choke" resistors 470, wherein using resistors 470 for said coupling may improve (e.g., reduce) an insertion loss characteristic of the phase inverting variable attenuator 400, and wherein the insertion loss may result from leakage through the gate capacitances of transistors M1 to M4. The source and drain terminals of transistors M1 to M4 may be biased at 0 Volts for at least the purpose of reducing a loss property of the phase inverting variable attenuator 400, e.g., by eliminating the Body Effect and maximizing the allowed gate-source voltage ($V_{GS}$).

The coupling of the control voltages $V_{C+}$ (450) and $V_{C-}$ (460) to the respective gate terminals of transistors M1 to M4 through resistors 470 may be advantageous. As described further herein, at least a phase-shifting resolution property of phase shifter 100 may be affected by a maximum attenuation (attenuation range) that phase inverting variable attenuator 400 may exhibit. Phase inverting variable attenuator 400 may be configured to exhibit maximum attenuation when the control voltages $V_{C+}$ (450) and $V_{C-}$ (460) may be of a same level. When the control voltages $V_{C+}$ (450) and $V_{C-}$ (460) may be of a same level, the (maximum) attenuation may be limited by signal leakage through parasitic capacitances (e.g., of transistors M1 to M4). Using resistors 470 may enable reducing the size of transistors M1 to M4 while maintaining low (minimum) insertion loss, wherein reducing the size of transistors M1 to M4 may result in lower parasitic capacitances and higher maximum attenuation (e.g., better phase-shifting resolution).

In some embodiments, a resistance value of resistors 470 (e.g., $R_C$) may be selected as high as possible for at least the purpose of reducing the insertion loss while maintaining a settling time of the control voltages 450 and 460 at the respective gates of transistors M1 to M4 as low as may be needed. For example, an antenna may comprise one or more phase shifters 100 and a steering speed property of the antenna may be limited, among other things, by a settling time of the one or more phase shifters 100 (that may depend on a settling time of the control voltages 450 and 460 at the respective gates of transistors M1 to M4). Thus, the selection of a resistance value for resistors 470 may comprise considering a required steering speed property of an antenna with one or more phase shifters 100 and selecting the resistance value so that the steering speed property of the antenna is not limited (or acceptably limited) by a settling time of the control voltages 450 and 460 at the respective gates of transistors M1 to M4.

In some embodiments, the phase-shifting resolution ($\theta_{min}$) of phase shifter 100 may be determined by the full attenuation range (R) of the phase inverting variable attenuator 400, for example in accordance with the formula: $\theta_{mm}=2*ARC\ SIN(1/R)$, wherein ARC SIN is the trigonometric inverse sine function. For example, a phase shifter 100 that may comprise a phase inverting variable attenuator 400 configured to exhibit an attenuation range of 40 dB (e.g., 1/R=1/100) may exhibit a phase-shifting resolution of roughly 1.15 degrees. As previously described, using resistors 470 may improve the attenuation range of the phase inverting variable attenuator 400, hence allow achieving finer phase-shifting resolution (e.g., lower values of $\theta_{min}$).

Let $R_{M1}$ to $R_{M4}$ denote the channel resistances of transistors M1 to M4, respectively. Let $R_{thru}$ and $R_{shnt}$ be defined as follows:

$$R_{thru} = \begin{cases} R_{M1}, R_{M2}, & \text{phase} = 0° \\ R_{M3}, R_{M4}, & \text{phase} = 180° \end{cases}$$

$$R_{shnt} = \begin{cases} R_{M3}, R_{M4}, & \text{phase} = 0° \\ R_{M1}, R_{M2}, & \text{phase} = 180° \end{cases}$$

It may follow from the above definition that $R_{thru}$ may always be lower than $R_{shnt}$. Neglecting parasitic resistances, the insertion loss ($S_{21}$), the input return loss ($S_{11}$) and the output return loss ($S_{22}$) characteristics of phase inverting variable attenuator 400 may be calculated as follows, wherein Zo may denote the characteristic impedance of the (differential) input and output ports of the phase inverting variable attenuator 400:

$$S_{21} = \frac{R_{shnt} - R_{thru}}{\left(\sqrt{R_{thru}} + \sqrt{R_{shnt}}\right)^2}$$

$$S_{11} = S_{22} = \frac{R_{thru} \cdot R_{shnt} - Z_0^2}{Z_0 \cdot (R_{thru} + R_{shnt} + Z_0) + R_{thru} \cdot R_{shnt}}$$

Two observations may be derived from the above equations. First, both the insertion loss (attenuation level) ($S_{21}$) and the return losses ($S_{11}$ and $S_{22}$) characteristics of the phase inverting variable attenuator 400 are affected (determined) by $R_{thru}$ and $R_{shnt}$. Second, if the minimum resistance values of Ram, and $R_{shnt}$ are limited (e.g., for at least the purpose of maintaining low parasitic capacitances), there is a tradeoff between a range of possible attenuation levels and the return loss characteristics of phase inverting variable attenuator 400.

In order to enable use of an entire range of sets of attenuation levels and return loss values, the channel resistances $R_{thru}$ and $R_{shnt}$ of transistors M1 to M4 may be controlled by two separate bias circuits, as shown in FIG. 5. Each bias circuit of the two bias circuits 500 may be configured to generate a gate control voltage, e.g., $V_{thru}$ or $V_{shnt}$, corresponding to a channel resistance $R_{thru}$ or $R_{shnt}$, respectively. Bias circuits 500 may comprise two multiplexers (561 and 562) that may be controlled by a common control signal 570 and configured to route any of the gate control voltages $V_{thru}$ and $V_{shnt}$ to transistors $M_1$ thru $M_4$ in accordance with the control signal 570 and the definitions of the corresponding channel resistances $R_{thru}$ and $R_{shnt}$ as provided above. The two input terminals of each of the two multiplexers may be coupled to both gate control voltages, $V_{thru}$ or $V_{shnt}$, but in opposite orders. For example, the $V_{thru}$ gate control voltage may be coupled to a first input of multiplexer 561 and to a second input of multiplexer 562, whereas the $V_{shnt}$ gate control voltage may be coupled to a second input of multiplexer 561 and to a first input of multiplexer 562. Furthermore, the output terminal of multiplexer 561 may be coupled to provide the control voltage $V_{C+}$ (450) to the phase inverting variable attenuator 400, and the output terminal of multiplexer 562 may be coupled to provide the control voltage $V_{C-}$ (460) to the phase inverting variable attenuator 400. Thus, the phase state of phase inverting variable attenuator 400 may be flipped using the common control signal 570.

Each bias circuit of the two bias circuits 500 may comprise a transistor 510 that may be of similar characteristics as any of the transistors M1 to M4 of the phase inverting variable attenuator 400. In some embodiments, where transistors M1 to M4 may be FET transistors, transistors 510 may also be FET transistors of characteristics similar to those of transistors M1 to M4. The bias current of each transistor 510, e.g., $I_{thru}$ or $I_{shnt}$, may be set using a current digital to analog converter (IDAC). In addition, the drain voltage of each transistor 510 may be set in accordance with a reference voltage 520 ($V_{ref}$), for example using a control loop (540, 550) that comprises an operational amplifier 530. Each control loop (540, 550) may be configured to maintain a gate control voltage, $V_{thru}$ or $V_{shnt}$, for the respective transistor 510 so that:

$$R_{510} = \frac{V_{ref}}{I_{DAC}}$$

Wherein the bias current $I_{DAC}$ is either $I_{thru}$ or $I_{shnt}$, as per the respective control loop. In some embodiments, the reference voltage 520 ($V_{ref}$) may be set to a lowest voltage that may be supported by the operational amplifier(s) 530, e.g., for at least the purpose of operating any of the transistors 510 at roughly the same operating conditions as those of transistors M1 to M4 of the phase inverting variable attenuator 400. In some embodiments, the reference voltage 520 ($V_{ref}$) may be set to approximately 100 millivolts (mV). In some embodiments, the physical gate width of transistors 510 may be smaller than the gate width of any of the transistors M1 to M4 of the phase inverting variable attenuator 400 for at least the purpose of reducing power consumption of transistors 510.

Since $R_{thru}$ may be always lower than $R_{shnt}$, the IDAC in the "thru" control loop 540 may always be required to provide higher current than the IDAC in the "shnt" control loop 550. To maximize an attenuation range of phase inverting variable attenuator 400 per given silicon area and simplify control over the bias circuits 500 by maintaining a same number of control bits in both IDAC devices, bias circuits 500 may comprise a low current IDAC for the "shnt" control loop 550 and a high current IDAC for the "thru" control loop 540. In some embodiments, both the low current IDAC and the high current IDAC may be 5-bit IDACs.

In some embodiments, the attenuation ($S_{21}$) and the return losses ($S_{11}$ and $S_{22}$) characteristics of the phase inverting variable attenuator 400 may be maintained over temperature and process variations. Considering that temperature-dependent and process-dependent parasitic capacitances may be negligible, the said characteristics may be maintained as long as the reference voltage ($V_{ref}$) and the bias currents ($I_{thru}$ and $I_{shnt}$) remain constant.

FIG. 6 shows a block diagram of an example phased array antenna 600 and a block diagram of an example phased array antenna 650. Phased array antenna 600 may be configured to be at least a transmitting antenna, whereas phased array antenna 650 may be configured to be at least a receiving antenna. In some embodiments, each of the phased array antennas 600 and 650 may be configured to use a dedicated aperture. In other embodiments, phased array antennas 600 and 650 may be configured to share a single (common) aperture. The phased array antennas 600 and 650, whether using dedicated apertures or a common aperture, may also be configured for satellite communications in any of the Ku-band or the Ka-band. The phased array antennas 600 and 650, whether using dedicated apertures or a common aperture, may also be configured to be used as airborne antennas.

Phased array antenna 600 may comprise a plurality of array elements coupled to an input port 610. An input signal may be received via input port 610 and then split to feed each of the array elements of the plurality of array elements. Each array element of the plurality of array elements may comprise at least a (high resolution) phase shifter 100, an amplifier 620 (e.g., a power amplifier), and a radiating (antenna) element 630. The phase shifter 100 may be configured to apply at least a phase-shift to the signal fed to the array element, wherein the phase-shift may vary in accordance with variations in a radiation pattern of phased array antenna 600. The phase-shifted signal may be amplified by amplifier 620 and the amplified signal may be transmitted using the radiating element 630. In some embodiments, each array element of the plurality of array elements of antenna 600 may further comprise an up converter (not shown in FIG. 6), wherein a common local oscillator signal may be provided to the up converters in all the plurality of array elements. In such embodiments, in each of the array elements, the phase shifter 100 may be used for applying a phase-shift to the local oscillator signal rather than to the signal fed to the array element. In such embodiments, the phase shifter 100 may be used at a limited number of frequencies (for example, at a single frequency) and therefore would exhibit high phase-shifting performance stability (as one of the variables affecting phase-shifting performance is reduced or eliminated).

Phased array antenna 650 may comprise a plurality of array elements that may be coupled to an output port 680. Each antenna element of the plurality of antenna elements may comprise at least a receiving (antenna) element 660, a low-noise amplifier 670, and a (high resolution) phase shifter 100. In each array element, a signal received by the receiving element 660 may be amplified by the low-noise amplifier 670, and the amplified signal may be phase-shifted by the phase shifter 100, wherein the phase-shift may vary in accordance with variations in a reception pattern of phased array antenna 650. The phase-shifted signals from the plurality of array elements may be combined together to form an output signal that may be transmitted at output port 680 of phased array antenna 650. In some embodiments, each array element of the plurality of array elements of antenna 650 may further comprise a down converter (not shown in FIG. 6), wherein a common local oscillator signal may be provided to the down converters in all the plurality of array elements. In such embodiments, in each of the array elements, the phase shifter 100 may be used for applying a phase-shift to the local oscillator signal rather than to the amplified received signal. In such embodiments, the phase shifter 100 may be used at a limited number of frequencies (for example, at a single frequency) and therefore would exhibit high phase-shifting performance stability.

The invention claimed is:

1. An apparatus comprising:
a splitter;
a first attenuator coupled to the splitter, wherein the first attenuator comprises:
a first input configured to provide a first control voltage; and
a second input configured to provide a second control voltage,
wherein the first control voltage and the second control voltage control a phase state of the first attenuator;
a second attenuator coupled to the splitter; and
a combiner coupled to the first attenuator and the second attenuator.

2. The apparatus of claim 1, wherein the first attenuator is configured to be in one of two phase states.

3. The apparatus of claim 1, wherein the first attenuator further comprises a plurality of transistors, wherein a first pair of transistors of the plurality of transistors are coupled to the first input, and
a second pair of transistors of the plurality of transistors are coupled to the second input.

4. The apparatus of claim 1, wherein:
the first input is coupled to a gate terminal of a first transistor via a first resistor and coupled to a gate terminal of a second transistor via a second resistor; and
the second input is coupled to a gate terminal of a third transistor via a third resistor and coupled to a gate terminal of a fourth transistor via a fourth resistor.

5. The apparatus of claim 4, wherein the first resistor, the second resistor, the third resistor, and the fourth resistor have a resistance value that is set based on a settling time of the first and second control voltages.

6. The apparatus of claim 1, further comprising biasing circuitry configured to control one or more channel resistances of one or more transistors of the first attenuator or the second attenuator.

7. The apparatus of claim 6, wherein the biasing circuitry comprises:
a first amplifier configured to generate, based on a reference voltage and a drain voltage of a first control loop transistor, a first gate control voltage; and
a second amplifier configured to generate, based on the reference voltage and a drain voltage of a second control loop transistor, a second gate control voltage.

8. The apparatus of claim 7, wherein the biasing circuitry further comprises:
a first multiplexer configured to generate, based on the first gate control voltage, the second gate control voltage, and a common control signal, the first control voltage; and
a second multiplexer configured to generate, based on the first gate control voltage, the second gate control voltage, and the common control signal, the second control voltage.

9. The apparatus of claim 8, wherein:
a first input of the first multiplexer and a second input of the second multiplexer are coupled to an output of the first amplifier; and
a second input of the first multiplexer and a first input of the second multiplexer are coupled to an output of the second amplifier.

10. A method comprising:
receiving, by a first attenuator coupled to a splitter and via a first input of the first attenuator, a first control voltage;
receiving, by the first attenuator and via a second input of the first attenuator, a second control voltage, wherein a phase state of the first attenuator is controlled by the first control voltage and the second control voltage; and
combining an output of the first attenuator and an output of a second attenuator that is coupled to the splitter.

11. The method of claim 10, wherein the combining comprises generating, based on the output of the first attenuator and the output of the second attenuator, a phase-shifted signal.

12. The method of claim 10, further comprising:
receiving, by at least a pair of transistors, the first control voltage and the second control voltage, wherein the at least the pair of transistors are coupled to one of the first input or the second input and are coupled to the output of the first attenuator; and
controlling, based on the first control voltage and the second control voltage, a phase state of the first attenuator.

13. The method of claim 12, wherein the receiving comprises:
receiving, by one of the at least the pair of transistors and via a first resistor, the first control voltage; and
receiving, by the other one of the at least the pair of transistors and via a second resistor, the second control voltage.

14. The method of claim 13, wherein the first resistor and the second resistor have a resistance value that is set based on a settling time of the first control voltage and the second control voltage.

15. The method of claim 12, further comprising:
controlling, by biasing circuitry, one or more channel resistances of the at least the pair of transistors.

16. An apparatus comprising:
a first amplifier configured to generate, based on a reference voltage and a drain voltage of a first control loop transistor, a first gate control voltage;
a second amplifier configured to generate, based on the reference voltage and a drain voltage of a second control loop transistor, a second gate control voltage;
a first multiplexer configured to generate, based on the first gate control voltage, the second gate control voltage, and based on a common control signal, a first control voltage; and
a second multiplexer configured to generate, based on the first gate control voltage, the second gate control voltage, and based on the common control signal, a second control voltage.

17. The apparatus of claim 16, wherein:
the first control loop transistor is controlled by the first gate control voltage; and
the second control loop transistor is controlled by the second gate control voltage.

18. The apparatus of claim 16, further comprising:
a splitter;
a first attenuator coupled to the splitter, wherein the first attenuator comprises:
a first input configured to receive the first control voltage from the first multiplexer; and
a second input configured to receive the second control voltage from the second multiplexer,
wherein the first control voltage and the second control voltage control a phase state of the first attenuator;
a second attenuator coupled to the splitter; and
a combiner coupled to the first attenuator and the second attenuator.

19. The apparatus of claim 18, wherein the first attenuator further comprises a plurality of transistors coupled to an input port and an output port, wherein:
a first pair of transistors of the plurality of transistors are coupled to the first input, and
a second pair of transistors of the plurality of transistors are coupled to the second input.

20. The apparatus of claim 18, wherein:
the first input is coupled to a gate terminal of a first transistor via a first resistor and coupled to a gate terminal of a second transistor via a second resistor; and
the second input is coupled to a gate terminal of a third transistor via a third resistor and coupled to a gate terminal of a fourth transistor via a fourth resistor.

* * * * *